(12) United States Patent
Nakao et al.

(10) Patent No.: US 6,496,684 B2
(45) Date of Patent: Dec. 17, 2002

(54) SPST SWITCH, SPDT SWITCH, AND COMMUNICATION APPARATUS USING THE SPDT SWITCH

(75) Inventors: Motoyasu Nakao; Akihiro Sasabata, both of Nagaokakyo; Hiroaki Tanaka, Mishima-gun, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/903,467

(22) Filed: Jul. 11, 2001

(65) Prior Publication Data

US 2001/0049265 A1 Dec. 6, 2001

Related U.S. Application Data

(62) Division of application No. 09/369,561, filed on Aug. 6, 1999, now Pat. No. 6,281,762.

(30) Foreign Application Priority Data

Oct. 7, 1998 (JP) .......................................... 10-285549

(51) Int. Cl.[7] ................................................ H01P 1/10
(52) U.S. Cl. .......................... 455/78; 455/73; 333/103; 333/262
(58) Field of Search .............................. 455/73, 78–82, 455/83; 333/101, 103, 104, 262; 327/283, 278, 281, 290, 288, 268

(56) References Cited

U.S. PATENT DOCUMENTS

| | | | | | |
|---|---|---|---|---|---|
| 5,774,792 A | * | 6/1998 | Tanaka et al. | ................. | 455/78 |
| 5,969,560 A | * | 10/1999 | Kohama et al. | ............ | 327/308 |
| 6,118,985 A | * | 9/2000 | Kawakyu et al. | ............. | 455/78 |
| 6,281,762 B1 | * | 8/2001 | Nakao et al. | ............... | 333/103 |

FOREIGN PATENT DOCUMENTS

| | | | | |
|---|---|---|---|---|
| JP | 1-202007 A | * | 8/1989 | ................. 333/104 |
| JP | 7-74604 | | 3/1995 | |

OTHER PUBLICATIONS

Japanese Examination Report dated Mar. 12, 2002, along with an English translation.

* cited by examiner

Primary Examiner—Doris H. To
(74) Attorney, Agent, or Firm—Ostrolenk, Faber, Gerb & Soffen, LLP (57) ABSTRACT

An SPST switch having a small transmission loss and a small power consumption is provided. The drain and the source of an FET are connected to each other in series through an induction element and a capacitor element, one terminal of the capacitor element is connected to a first terminal, the other terminal is connected to a second terminal, the gate of the FET is connected to a control terminal, the capacitance of the capacitor element is made equal to the OFF capacitance of the FET, and the inductance of the induction element is set to be such a value that the induction element resonates at a signal frequency with the capacitor element.

4 Claims, 6 Drawing Sheets

SPST SWITCH, SPDT SWITCH, AND COMMUNICATION APPARATUS USING THE SPDT SWITCH

This application is a divisional of 09/369,561 filed Aug. 6, 1999, now U.S. Pat. No. 6,281,762.

BACKGROUND OF THE INVENTION

1. Field of the Invention

The present invention generally relates to a single pole single throw (SPST) switch, a single pole double throw (SPDT) switch, and a communication apparatus using the SPDT switch and, more particularly, to an SPST switch, an SPDT switch, as an antenna switch of a mobile communication apparatus and a communication apparatus using these switches.

2. Description of the Related Art

With a recent tendency to reduce the power consumption of mobile communication apparatuses, reductions in transmission loss and power consumption are required for an antenna switch.

Figure 11:
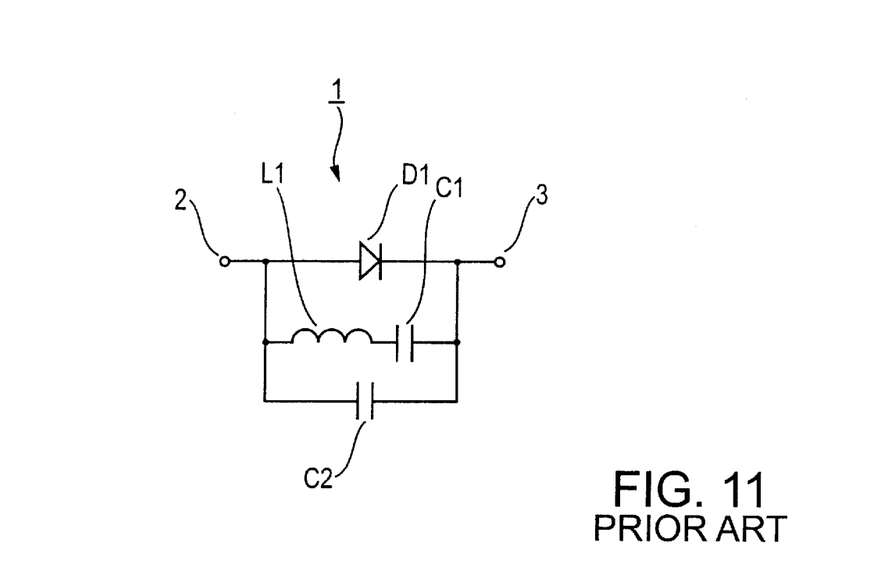
FIG. 11 is a circuit diagram showing a conventional SPST switch.

FIG. 11 shows a circuit diagram of an SPST switch having a basic configuration which is disclosed in Japanese Unexamined Patent Publication No. 9-191268 as a conventional SPST (Single Pole Single Throw) switch (switch for connecting and disconnecting two terminals to each other). In FIG. 11, an SPST switch 1 includes a first terminal 2, a second terminal 3, a diode D1 connected between the first terminal 2 and the second terminal 3, an induction element L1 and a capacitor element C1 which are connected in series with each other and are connected in parallel with the diode D1, and a capacitor element C2 connected in parallel with the diode D1.

In the SPST switch 1 arranged as described above, when a current flows in the diode D1, the diode D1 is equivalent to a resistor having a small resistance (ON resistance), the first terminal 2 and the second terminal 3 are almost directly connected to each other, and the SPST switch 1 is turned on. At this time, the induction element L1 or the capacitor elements C1 and C2 do not adversely affect a signal passing through the SPST switch 1. In contrast, when no current flows in the diode D1, the diode D1 is equivalent to a capacitor element having a small capacitance (OFF capacitance). However, in this case, the diode D1 may resonate at a signal frequency which is a function of the OFF capacitance in parallel with the induction element L1 and the capacitor elements C1 and C2. An impedance between the first terminal 2 and the second terminal 3 becomes almost infinite, and the SPST switch 1 is turned off. In this manner, by controlling whether a current flows in the diode D1 or not, the switch 1 exhibits the characteristics of an SPST switch.

Figure 12:
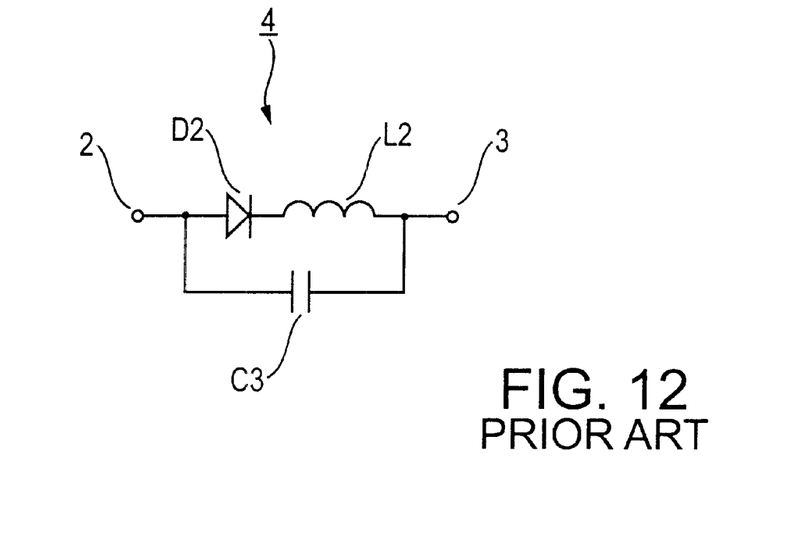
FIG. 12 is a circuit diagram showing another conventional SPST switch.

FIG. 12 shows a circuit diagram of an SPST switch having a basic configuration which is disclosed as another conventional SPST switch in Japanese Unexamined Patent Publication No. 9-191268. The same reference numerals as in FIG. 11 denote the same parts or similar parts in FIG. 12, and a detailed description thereof will be omitted. In FIG. 12, an SPST switch 4 is arranged such that a first terminal 2 and a second terminal 3 are connected to each other in series through a diode D2 and an induction element L2, and a capacitor element C3 is connected in parallel to the diode D2 and the induction element L2.

In the SPST switch 4 arranged as described above, when a current flows in the diode D2, the diode D2 can be almost neglected because the diode D2 is equivalent to a resistor having a small resistance (ON resistance). The induction element L2 and the capacitor element C3 are connected in parallel with each other between the first terminal 2 and the second terminal 3. When the values of the induction element L2 and the capacitor element C3 are set such that the induction element L2 and the capacitor element C3 resonate at a signal frequency, an impedance between the first terminal 2 and the second terminal 3 becomes almost infinite, and the SPST switch 4 is turned off. In contrast, when no current flows in the diode D2, the diode D2 is equivalent to a capacitor element having a small capacitance (OFF capacitance) and the impedance of the path through the diode D2 and the induction element L2 between the first terminal 2 and the second terminal 3 is high. However, when the capacitance of the capacitor element C3 is set to be a relatively large value, the impedance of the path through the capacitor element C3 is low, the first terminal 2 and the second terminal 3 are almost directly connected to each other, and the SPST switch 4 is turned on. In this manner, the switch 4 exhibits the characteristics of an SPST switch by controlling whether a current flows in the diode D2 or not. Note that the SPST switch 4 operates in reverse to the SPST switch 1 shown in FIG. 11 by controlling whether a current flows in the diode or not.

Figure 13:
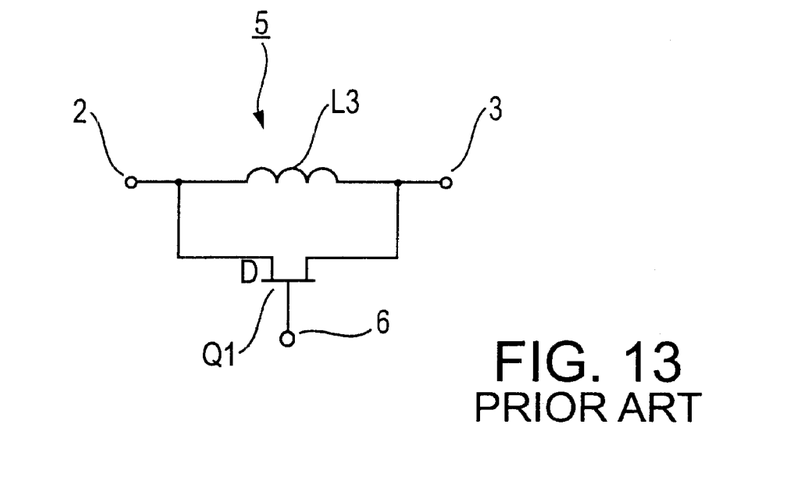
FIG. 13 is a circuit diagram showing still another conventional SPST switch.

FIG. 13 shows a circuit diagram of an SPST switch having a basic configuration which is disclosed as still another conventional SPST switch in Japanese Unexamined Patent Publication No. 7-303001. The same reference numerals as in FIG. 11 denote the same parts or similar parts in FIG. 13, and a detailed description thereof will be omitted. In FIG. 13, an SPST switch 5 is arranged such that an induction element L3 is connected to a first terminal 2 and a second terminal 3, and a drain and a source of a FET Q1 are connected to both terminals of the induction element L3, respectively. In this case, the gate of the FET Q1 is connected to a control terminal 6. In FIG. 13, with respect to the terminals of the FET Q1, a symbol D is added to only the drain, while symbols at the source and the gate are omitted.

In the SPST switch 5 arranged as described above, when the FET Q1 is in an ON state, the source-drain portion of the FET Q1 is equivalent to a resistor having a small resistance (ON resistance). For this reason, the first terminal 2 and the second terminal 3 are almost directly connected to each other through the FET Q1, and the SPST switch 5 is turned on. In contrast, when the FET Q1 is in an OFF state, the source-drain portion of the FET Q1 is equivalent to a capacitor element having a small capacitance (OFF capacitance). In this case, when only the FET Q1 is connected between the first terminal 2 and the second terminal 3, the OFF capacitance of the FET Q1 operates to decrease the impedance between the first terminal 2 and the second terminal 3. However, when the induction element L3 is connected, it may resonate in parallel with the OFF capacitance of the FET Q1 at a signal frequency, the impedance between the first terminal 2 and the second terminal 3 can be made almost infinite, and the SPST switch 5 is turned off. In this manner, when the FET Q1 is turned on or off, the switch 5 exhibits the characteristics of an SPST switch.

When two SPST switches described above are combined with each other, the combination can also be operated as an SPDT (Single Pole Double Throw) switch (switch having three terminals in which one (common) terminal may be connected to either one of the two remaining terminals).

However, in the SPST switch 1 shown in FIG. 11, since the first terminal 2 and the second terminal 3 are connected to each other through the diode D1 when the SPST switch 1 is in an ON state, a transmission loss, although it is small, is disadvantageously generated due to the ON resistance of the diode D1. In the SPST switch 4 shown in FIG. 12, since the first terminal 2 and the second terminal 3 are connected to each other through the capacitor element C3 when the SPST switch 4 is in an ON state, a transmission loss is disadvantageously generated due to the impedance of the capacitor element C3. In any one of the SPST switches 1 and 4, a direct current must continuously flow in the switches 1 or 4 to turn the diode D1 or D2 on, and a relatively large power consumption is disadvantageously required.

Also in the SPST switch 5 shown in FIG. 13, since the first terminal 2 and the second terminal 3 are connected to each other through the FET Q1 when the SPST switch 5 is in an ON state, a transmission loss is disadvantageously generated due to the ON resistance of the FET Q1.

As in an SPDT switch, using the SPST switches described above, the same problems as described above are exhibited.

SUMMARY OF THE INVENTION

The present invention has as an object to solve the above problems and to provide: (i) an SPST switch having a small transmission loss and a small power consumption, (ii) an SPDT switch, and (iii) a communication apparatus using the SPDT switch.

In order to solve the above problems, an SPST switch according to an aspect of the present invention includes first and second terminals, a control terminal, a FET, an induction element, and a capacitor element. The drain and the source of the FET are connected to each other in series through the induction element and the capacitor element, one terminal of the capacitor element is connected to the first terminal, the other terminal is connected to the second terminal, the gate of the FET is connected to the control terminal, the capacitance of the capacitor element is made equal to the OFF capacitance of the FET, and the inductance of the induction element is set to be such a value that the induction element resonates at a signal frequency with the capacitor element.

An SPDT switch according to a second aspect of the present invention includes first, second, and third terminals, first and second control terminals, first and second FETs, first and second induction elements, and first and second capacitor elements. The drain and the source of the first FET are connected to each other in series through the first induction element and the first capacitor element, the gate of the first FET is connected to the first control terminal, the capacitance of the first capacitor element is equal to the OFF capacitance of the first FET, and the inductance of the first induction element is set to be such a value that the first induction element resonates at a signal frequency with the first capacitor element. The drain and the source of the second FET are connected to each other in series through the second induction element and the second capacitor element, the gate of the second FET is connected to the second control terminal, the capacitance of the second capacitor element is made equal to the OFF capacitance of the second FET, and the inductance of the second induction element is set to be such a value that the second induction element resonates at a signal frequency with the second capacitor element. One terminal of each of the first and second capacitor elements are connected to each other and to the first terminal, the other terminal of the first capacitor element is connected to the second terminal, and the other terminal of the second capacitor element is connected to the third terminal.

An SPDT switch according to a third aspect of the present invention includes first, second, and third terminals, a control terminal, a FET, an induction element, a capacitor element, and a switch element having two signal terminals and a switching terminal. The switch element is turned on/off to be interlocked with an ON/OFF operation of the FET. The drain and the source of the FET are connected to each other in series through the induction element and the capacitor element, the gate of the FET is connected to the control terminal, the capacitance of the capacitor element is equal to the OFF capacitance of the FET, and the inductance of the induction element is set to be such a value that the induction element resonates at a signal frequency with the capacitor terminal. The switching terminal of the switch element is connected to the control terminal, one terminal of the capacitor element is connected to the first terminal and the other terminal is connected to the second terminal, one of the two signal terminals of the switch element is connected to one terminal of the capacitor element and the other is connected to the third terminal.

With the configuration described above, in an SPST switch and an SPDT switch according to the present invention, a transmission loss and a power consumption can be reduced.

Also in a communication apparatus according to the present invention, reductions in transmission loss and power consumption can be achieved.

DESCRIPTION OF THE PREFERRED EMBODIMENTS

Figure 1:
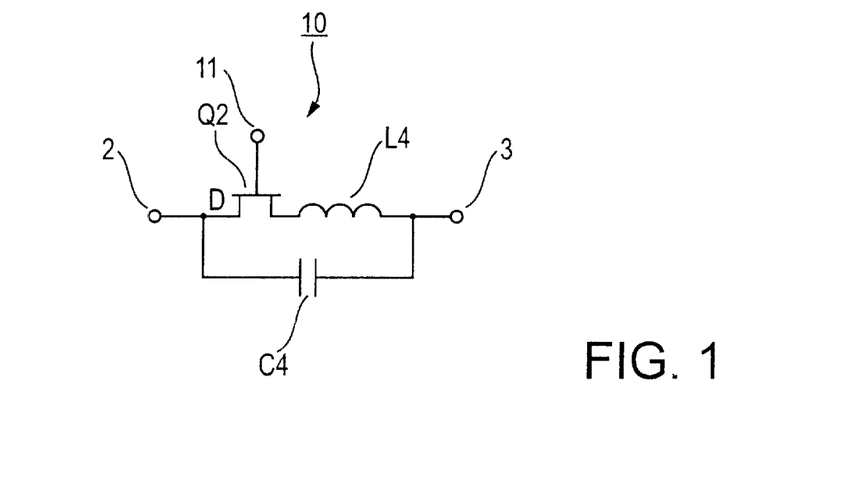
FIG. 1 is a circuit diagram showing an embodiment of an SPST switch according to the present invention.

FIG. 1 shows an embodiment of an SPST switch according to the present invention. The same reference numerals as in FIG. 11 denote the same parts or similar parts in FIG. 1. In FIG. 1, an SPST switch 10 includes a first terminal 2, a second terminal 3, an FET Q2, an induction element L4, and a capacitor element C4. In this case, a drain and a source of the FET Q2 are connected to each other in series through the induction element L4 and the capacitor element C4, one terminal of the capacitor element C4 is connected to the first terminal 2, and the other terminal is connected to the second terminal 3. A gate of the FET Q2 is connected to a control terminal 11. The capacitance of the capacitor element C4 is set to be equal to the value of a small capacitance (OFF capacitance Coff) between the drain and the source of the FET Q2 in an OFF state. The inductance of the induction element L4 is set such that the induction element L4 resonates at a signal frequency in parallel with the capacitor element C4, or the induction element L4 resonates at a signal frequency in series with the OFF capacitance Coff of the FET Q2. In FIG. 1, with respect to the terminals of the FET Q2, a symbol D is added to only the drain, and symbols at the source and the gate symbols are omitted. Similarly, in FIG. 2 and the subsequent drawings, source and gate symbols are omitted.

Figure 2:
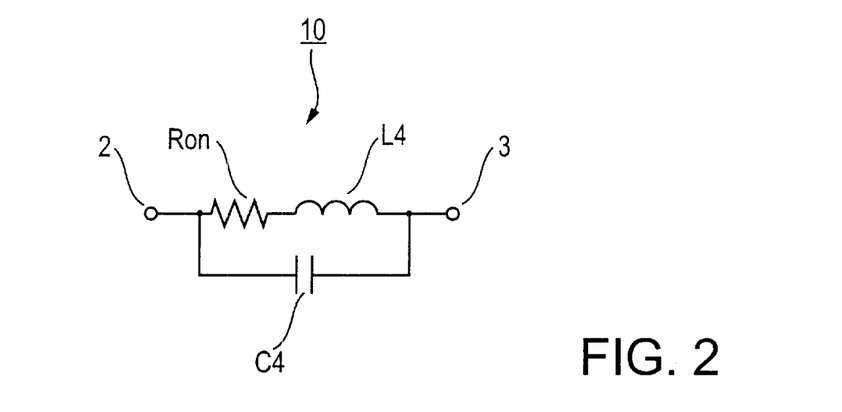
FIG. 2 is a circuit diagram showing an equivalent circuit in an OFF state of the SPST switch in FIG. 1.
Figure 3:
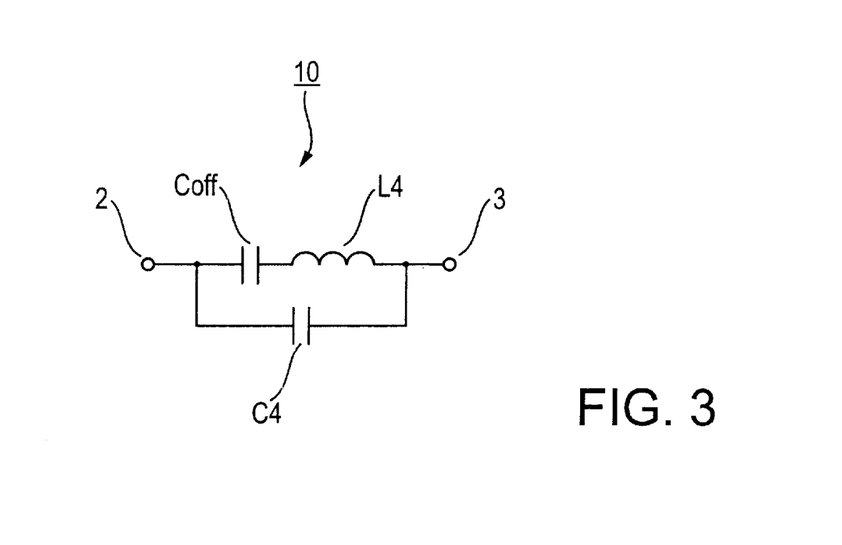
FIG. 3 is a circuit diagram showing an equivalent circuit in an ON state of the SPST switch in FIG. 1.

In the SPST switch 10 arranged as described above, an equivalent circuit in an ON state of the FET Q2 and an equivalent circuit in an OFF state of the FET Q2 are shown in FIG. 2 and FIG. 3, respectively. When the FET Q2 is in an ON state, as shown in FIG. 2, the FET Q2 is equivalent to a resistor having a small resistance (ON resistance Ron) and can be almost neglected. For this reason, the first terminal 2 and the second terminal 3 are connected in parallel to the induction element L4 and the capacitor element C4. Since the induction element L4 and the capacitor element C4 are resonated in parallel at a signal frequency, the impedance between the first terminal 2 and the second terminal 3 becomes almost infinite, and the SPST switch 10 is turned off.

In contract to this, when the FET Q2 is in an OFF state, as shown in FIG. 3, the FET Q2 is equivalent to a capacitor element having a small capacitance (OFF capacitance Coff). Since the induction element L4 and the capacitance Coff of the FET Q2 resonate at a signal frequency in series with each other, the impedance between the first terminal 2 and the second terminal 3 becomes almost zero, and the SPST switch 10 is turned on. At this time, the impedance of the capacitor element C4 does not adversely affect a signal passing through the SPST switch 10.

In this manner, the SPST switch 10 can sufficiently reduce transmission loss since the impedance between the first terminal 2 and the second terminal 3 becomes almost zero in an ON state. In contrast, since the impedance between the first terminal 2 and the second terminal 3 is almost infinite in an OFF state, isolation between the first terminal 2 and the second terminal 3 can be increased. In addition, since the SPST switch 10 is turned on in an OFF state of the FET Q2 to cause a signal to flow, the electric power of the signal which can pass through the SPST switch 10 does not depend on the tolerable voltage property in the ON state of the FET Q2, and the SPST switch 10 allows relatively high electric power to pass therethrough. Furthermore, similarly, since the SPST switch 10 is turned on in an OFF state of the FET Q2 to cause a signal to flow, the signal is not easily affected by nonlinearity (distortion or the like of an output signal with respect to an input signal) occurring when a current flows in the drain-source portion of the FET Q2 in an ON state of the FET Q2, and the linearity of a passing signal can be maintained in the range of low electric power to high electric power.

In the SPST switch 10 shown in FIG. 1, although the source of the FET Q2 is connected to the induction element L4, a configuration in which the drain and the source of the FET Q2 are switched connecting the drain of the FET Q2 to the induction element L4 may be employed. This option can be similarly applied to the subsequent embodiments.

When the SPST switch 10 is implemented as an actual electronic part, a configuration in which an FET, an induction element, and a capacitor element are mounted on a circuit board as respective parts to be connected to each other may be employed, or a configuration in which the SPST switch 10 is implemented as an integrated circuit (e.g., an MMIC) on one semiconductor substrate may be employed. Also, a configuration in which an integrated circuit obtained by integrating an active element such as a FET and a dielectric substrate having an induction element and a capacitor element formed thereon are combined with each other to be connected to each other may also be employed. In addition, a configuration in which respective FETs or integrated circuits obtained by integrating FETs are mounted on a laminated multi-layered substrate having an induction element or a capacitor element formed therein and are connected to each other may be employed.

Figure 4:
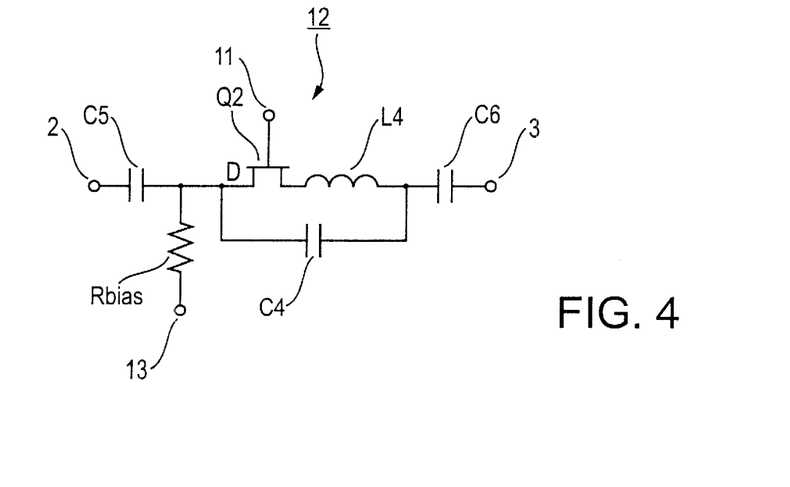
FIG. 4 is a circuit diagram showing another embodiment of an SPST switch according to the present invention.

FIG. 4 shows another embodiment of an SPST switch according to the present invention. The same reference numerals as in FIG. 1 denote the same parts or similar parts in FIG. 4, and a detailed description thereof will be omitted. In FIG. 4, in an SPST switch 12, a DC-cut capacitor element C5 is connected between a first terminal 2 and the connection portion of the drain of a FET Q2 and the capacitor element C4. A DC-cut capacitor element C6 is connected between a second terminal 3 and the connection portion between an induction element L4 and the capacitor element C4. The drain of the FET Q2 is connected to a bias terminal 13 through a bias resistor Rbias.

In the SPST switch 12 arranged as described above, a bias voltage is applied from the bias terminal 13 to the drain of the FET Q2. At this time, since the source of the FET Q2 is open in a DC manner, a direct current does not flow in the drain-source portion of the FET Q2, and the drain and the source of the FET Q2 are shifted up in a DC manner (kept at a positive voltage higher than 0 V). For this reason, when a depletion-type FET is used as the FET Q2, the FET Q2 can be switched by switching a voltage applied to the gate between a positive voltage and 0 V, and the SPST switch 12 can be driven by a positive power source. In addition, since the FET is a voltage-driven element, a control current need not flow in the gate, so that a reduction in power consumption can be achieved.

Figure 5:
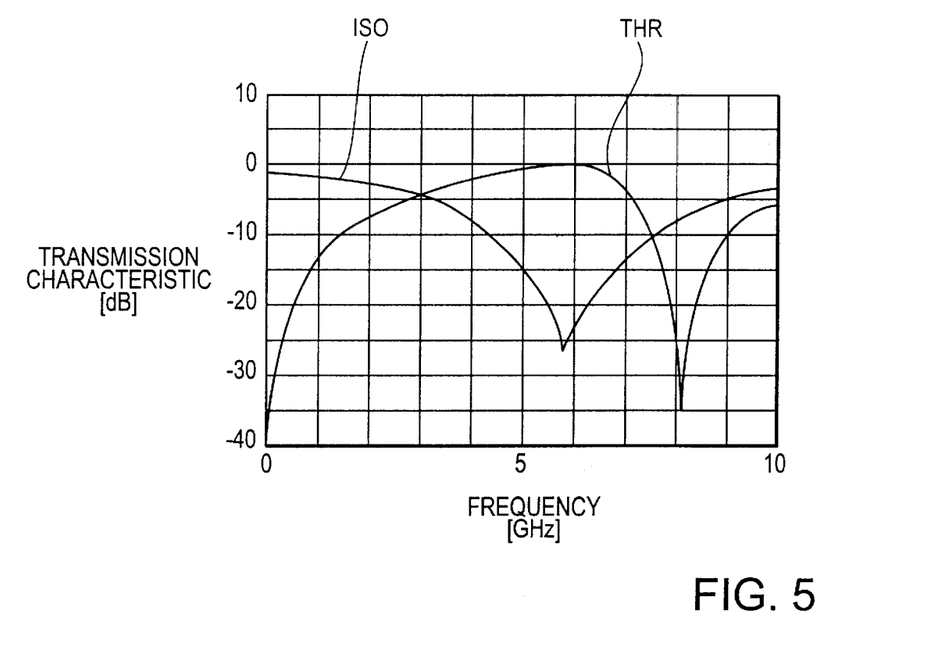
FIG. 5 is a graph showing transmission loss and isolation of the SPST switch in FIG. 4.

FIG. 5 shows a transmission loss (thr) and an isolation (iso) (transmission loss in an OFF state) of the SPST switch 12 shown in FIG. 4. A simulation using a depletion-type GaAs FET having a total gate width of 600 $\mu$m as the FET Q2, a capacitor having 0.2 pF almost equal to the OFF capacitance of the FET Q2 as the capacitor element C4, and an inductor L4 having 3.9 nH set such that the inductor L4 resonates in parallel at a signal frequency of 5.8 GHz with the capacitor element C4 was performed. A bias voltage was set at 3 V, and a control voltage was switched between 0 V and 3 V (positive power source driving). As a result, the transmission loss (thr) obtained when the SPST switch 12 is turned on at a signal frequency of 5.8 GHz was −0.23 dB, and the isolation obtained when the SPST switch 12 is turned off was −25.8 dB. Therefore, it is understood that a transmission loss can be reduced to obtain high isolation. In addition, it is understood that the SPST switch 12 is operated by only one positive power source, although a depletion-type FET is used.

Figure 6:
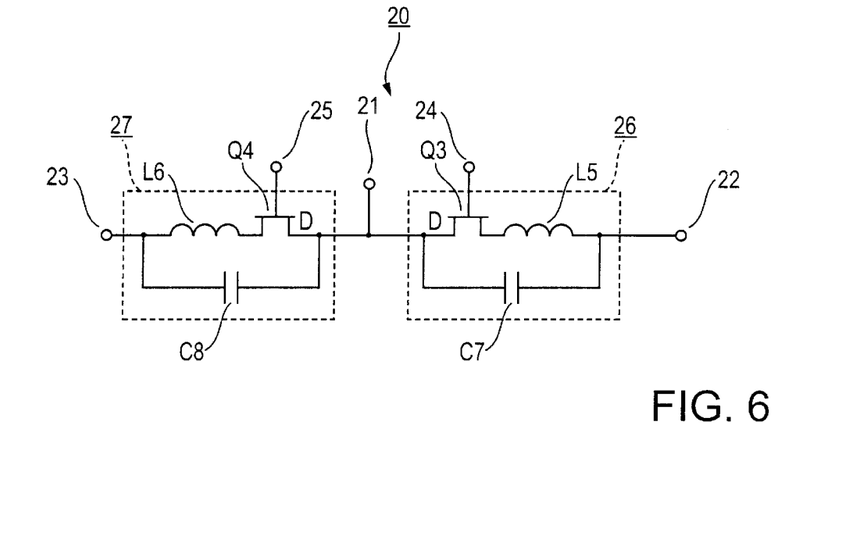
FIG. 6 is a circuit diagram showing an embodiment of an SPDT switch according to the present invention.

FIG. 6 shows an embodiment of an SPDT switch according to the present invention. In FIG. 6, an SPDT switch 20 includes a first terminal 21, a second terminal 22, a third terminal 23, a first FET Q3, a first induction element L5, a first capacitor element C7, a first control terminal 24, a second FET Q4, a second induction element L6, a second capacitor element C8, and a second control terminal 25. In this case, the drain and the source of the first FET Q3 are connected to each other in series with the first induction element L5 and the first capacitor element C7, and one terminal of the first capacitor element C7 is connected to the second terminal 22. The drain and the source of the second FET Q4 are connected to each other in series through the second induction element L6 and the second capacitor element C8, and one terminal of the second capacitor element C8 is connected to the third terminal 23. In addition, the other terminal of the first capacitor element C7 (i.e., the drain of the first FET Q3) is connected to the other terminal (i.e., the drain of the second FET Q4) of the second capacitor element C8 and to the first terminal 21. The gate of the first FET Q3 is connected to the first control terminal 24, and the gate of the second FET Q4 is connected to the second control terminal 25. The capacitance of the first capacitor element C7 is set to be equal to the value of a small capacitance (OFF capacitance Coff1) of the drain-source portion of the first FET Q3 in an OFF state, and the inductance of the first induction element L5 is set such that the first induction element L5 resonates at a signal frequency in parallel with the first capacitor element C7 or the first induction element L5 resonates in series with the OFF capacitance Coff1 of the first FET Q3. In addition, the capacitance of the second capacitor element C8 is set to be equal to the value of a small capacitance (OFF capacitance Coff2) of the drain-source portion of the second FET Q4 in an OFF state, and the inductance of the second induction element L6 is set such that the second induction element L6 resonates at a signal frequency in parallel with the second capacitor element C8 or resonates in series with the OFF capacitance Coff2 of the second FET Q4.

Since the combination of the first FET Q3, the induction element L5, and the capacitor element C7 and the combination of the second FET Q4, the induction element L6, and the capacitor element C8 have basically the same configuration as that of the SPST switch 10 shown in FIG. 1, the combinations are called an SPST section 26 and an SPST section 27, respectively. More specifically, it is understood that the SPDT switch 20 has a configuration in which two SPST sections 26, 27 each having the same configuration as that of the SPST switch 10 are connected to each other.

In the SPDT switch 20 as described above, the operation of each SPST section is the same as that of the SPST switch 10 shown in FIG. 1, and a detailed description thereof will be omitted. However, when the SPST section 26 and the SPST section 27 are alternately turned on and off, a state in which the first terminal 21 and the second terminal 22 are connected to each other or a state in which the first terminal 21 and the third terminal 23 are connected to each other is achieved, and the switch 20 exhibits the characteristics of an SPDT switch. As is apparent from the fact that the SPST section having the same configuration as that of the SPST switch 10 shown in FIG. 1 is used, the SPDT switch 20 has a small transmission loss and a large isolation, can withstand relatively high electric power, and can maintain the linearity of the signal up to high electric power.

Figure 7:
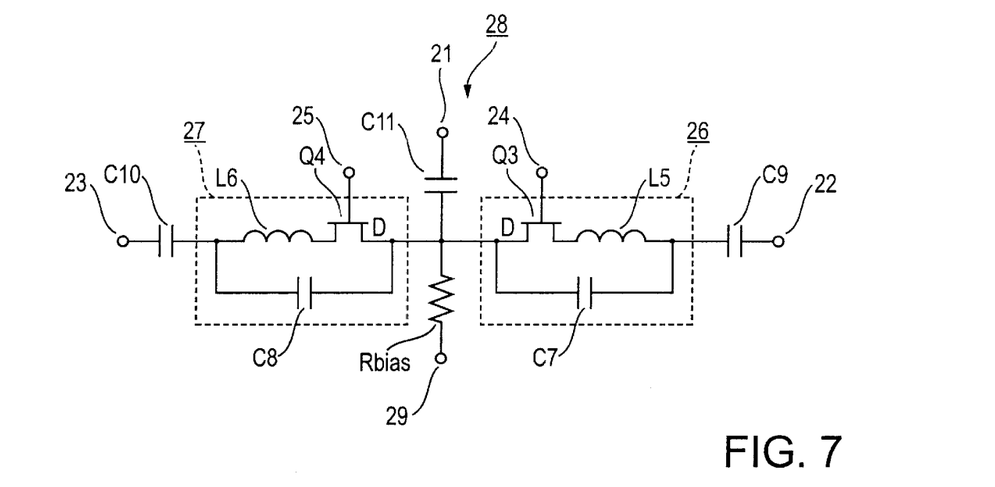
FIG. 7 is a circuit diagram showing another embodiment of an SPDT switch according to the present invention.

FIG. 7 shows another embodiment of an SPDT switch according to the present invention. The same reference numerals as in FIG. 4 and 6 denote the same parts or similar parts in FIG. 7, and a detailed description thereof will be omitted. In FIG. 7, in an SPDT switch 28, a DC-cut capacitor element C9 is connected between a second terminal 22 and the connection portion between an induction element L5 and a capacitor element C7, a DC-cut capacitor element C10 is connected between a third terminal 23 and the connection portion between an induction element L6 and a capacitor element C8, and a DC-cut capacitor element C11 is connected between a first terminal 21 and the connection portion between the drain of a first FET Q3 and the drain of a second FET Q4. The drain of the first FET Q3 and the drain of the second FET Q4 are connected to a bias terminal 29 through a bias resistor Rbias.

In the SPDT switch 28 as described above, the sources of the first FET Q3 and the second FET Q4 are open (in a DC manner), and a direct current does not flow in the drain-source portions of the first FET Q3 and the second FET Q4. For this reason, the potentials of the drains and the sources are shifted up (in a DC manner). As in the SPST switch 12 shown in FIG. 4, in addition to the advantage of the SPDT switch 20 shown in FIG. 6, an advantage that the SPDT switch 28 can be driven by a positive power source even when a depletion-type FET is used can also be obtained.

Figure 8:
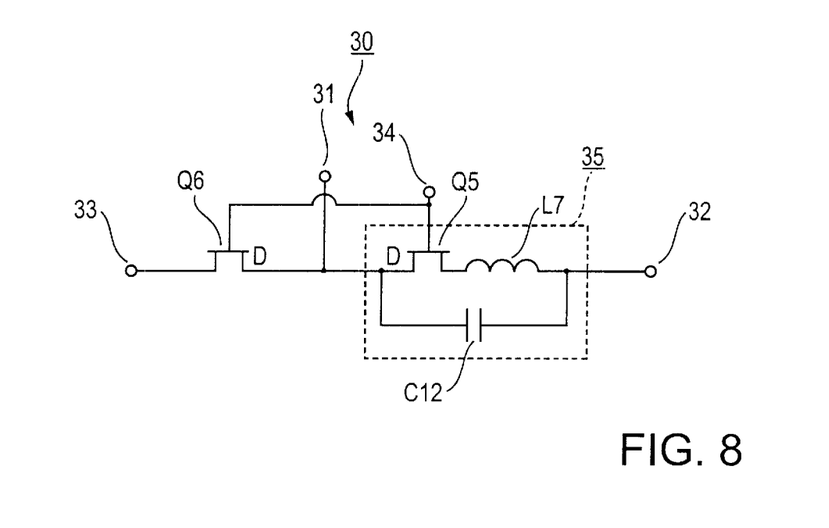
FIG. 8 is a circuit diagram showing still another embodiment of an SPDT switch according to the present invention.

FIG. 8 shows still another embodiment of an SPDT switch according to the present invention. In FIG. 8, an SPDT switch 30 is constituted by a first terminal 31, a second terminal 32, a third terminal 33, an FET Q5, an induction element L7, a capacitor element C12, a control terminal 34, and a FET Q6 which is a switch element having a drain and a source serving as two signal terminals and a gate serving as a switching terminal. In this case, the drain and the source of the FET Q5 are connected to each other in series through the induction element L7 and the capacitor element C12, and one terminal of the capacitor element C12 is connected to the second terminal 32. The source of the FET Q6, serving as one of the signal terminals, is connected to the third terminal 33, the other terminal (i.e., the drain of the FET Q5) of the capacitor element C12 is connected to the drain of the FET Q6 serving as the other signal terminal and to the first terminal 31. The gate of the FET Q5 is connected to the gate of the FET Q6 serving as the switching terminal and to the control terminal 34. The capacitance of the capacitor element C12 is set to be equal to a small capacitance (OFF capacitance Coff3) of the drain-source portion of the second FET Q5 in an OFF state, and the inductance of the induction element L7 is set such that the induction element L7 resonates at a signal frequency in parallel with the capacitor element C12 or resonates in series with the OFF capacitance Coff3 of the second FET Q5.

In this case, since the combination of the FET Q5, the induction element L7, and the capacitor element C12 has basically the same configuration as that of the SPST switch 10 shown in FIG. 1, the combination is called an SPST section 35. More specifically, it is understood that the SPDT switch 30 has a configuration in which the SPST section 35 having the same configuration as that of the SPST switch 10 is connected to the FET Q6 serving as one switch element.

In the SPDT switch 30 as described above, the operation of the SPST section 35 is the same as that of the SPST switch 10 shown in FIG. 1, and a detailed description thereof will be omitted. However, as is apparent from the fact that the gates of the FET Q5 and the FET Q6 are connected to the same control terminal 34, these FETs are simultaneously turned on or off. In this case, when the FET Q6 is in an ON state, the first terminal 31 and the third terminal 33 are connected to each other through a small resistance (ON resistance) of a drain-source portion in the FET Q6. In contrast to this, when the FET Q6 is in an OFF state, since the first terminal 31 and the third terminal 33 are connected to each other through a small capacitance (OFF capacitance) of a small drain-source portion in the FET Q6, an impedance between the first terminal 31 and the third terminal 33 increases to disconnect the first terminal 31 and the third terminal 33. More specifically, a path between the first terminal 31 and the third terminal 33 is turned on when the FET Q6 is in an ON state, and is turned off when the FET Q6 is in an OFF state. On the other hand, a path between the first terminal 31 and the second terminal 32 is turned off by the SPST section 35 when the first FET QS is in an ON state, and is turned on when the first FET Q5 is in an OFF state. In this manner, a connection destination of the first terminal 31 can be switched to the second terminal 32 or the third terminal 33 by one ON or OFF signal applied from the control terminal 34. For this reason, in comparison with the SPDT switch 20 shown in FIG. 6, the SPDT switch 30 requires only one control terminal. In addition, in comparison with the SPDT switch 20, the number of induction elements and the number of capacitor elements can be reduced by one each, and a cost reduction can be achieved.

In this case, with respect to the path between the first terminal 31 and the third terminal 33, the SPDT switch 30 is a switch using a simple FET, the SPDT switch 30 does not achieve the same merits as those in the SPST switch 10 according to the present invention shown in FIG. 1. However, for example, when the SPDT switch 30 is used as an antenna switch, the first terminal 31 is set on an antenna side, the second terminal 32 is set on an RX side which must receive a signal having low electric power, and the third terminal 33 is set on a TX side which outputs relatively high electric power. The FET Q5 is turned on in a transmission state to conduct, the FET Q5 can be prevented from being damaged by relatively high electric power in the transmission state. More specifically, even if the tolerable voltage of the FET Q5 is small, the FET Q5 can be used.

Figure 9:
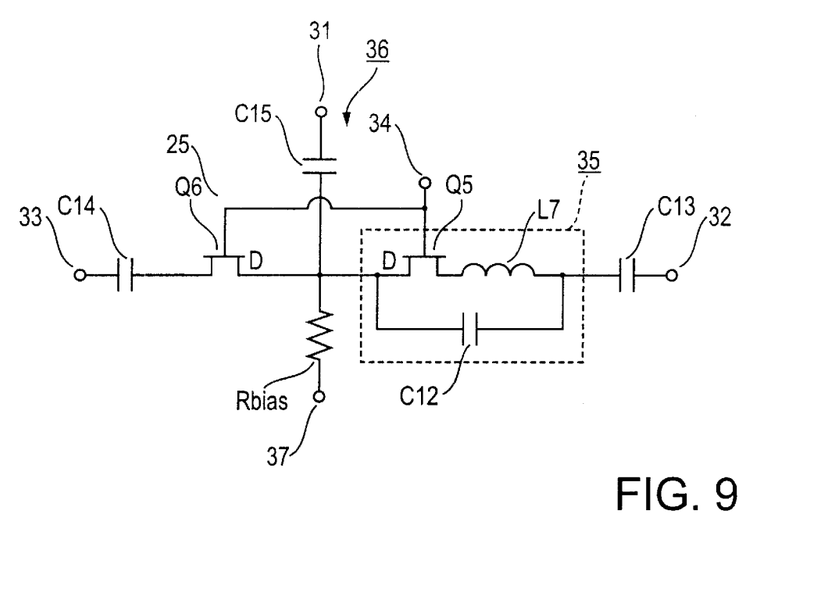
FIG. 9 is a circuit diagram showing still another embodiment of an SPDT switch according to the present invention.

FIG. 9 shows still another embodiment of an SPDT switch according to the present invention. The same reference numerals as in FIG. 4 and 8 denote the same parts or similar parts in FIG. 9, and a detailed description thereof will be omitted. In FIG. 9, in an SPDT switch 36, a DC-cut capacitor element C13 is connected between a second terminal 32 and the connection portion between an induction element L7 and a capacitor element C12, a DC-cut capacitor element C14 is connected between a third terminal 33 and the source of an FET Q6, and a DC-cut capacitor element C15 is connected between a first terminal 31 and the connection portion between the drain of an FET Q5 and the drain of an FET Q6. The drain of the FET Q5 and the drain of the FET Q6 are connected to a bias terminal 37 through a bias resistor Rbias.

In the SPDT switch 36 arranged as described above, the sources of the FET Q5 and the FET Q6 are open (in a DC manner), and a direct current does not flow in the drain-source portions of the FET Q5 and the FET Q6. For this reason, the potentials of the drains and the sources are shifted up (in a DC manner). As in the SPST switch 12 shown in FIG. 4, in addition to the advantage of the SPDT switch 20 shown in FIG. 6, an advantage that the SPDT switch 36 can be driven by a positive power source even if a depletion-type FET is used can also be obtained.

In the SPDT, switches 30 and 36 shown in FIG. 8 and FIG. 9, respectively, although FETs are used as switch elements, the switch elements are not limited to FETs. Any switch element, e.g., an electric element such as a transistor or a vacuum tube or a mechanical element such as a relay, which is turned on/off to be interlocked with the FET Q5 by the same signal as that of a control signal applied to the gate of the FET Q5, may be used.

In general, in an FET, the drain and the source are almost symmetrical with respect to the gate, the drain can also be used as a source, and the source can also be used as the drain. For this reason, in each of the embodiments described above, the connection relationship between the drain and the source of each FET is not fixed, and a configuration in which the drain and the source are inter-changed with each other may be employed. With respect to a configuration in which a FET and a bias terminal are connected to each other, the source may be connected to the bias terminal, and the drain may be open (in a DC manner).

Figure 10:
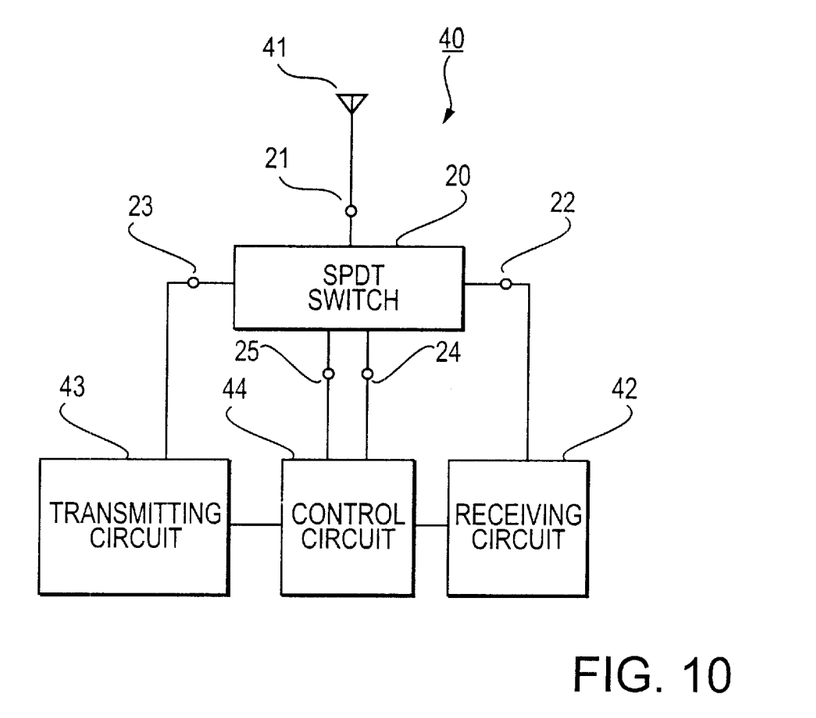
FIG. 10 is a block diagram showing an embodiment of a communication apparatus according to the present invention.

FIG. 10 shows a block diagram of an embodiment of a communication apparatus according to the present invention. In FIG. 10, a communication apparatus 40 includes an antenna 41, the SPDT switch 20 shown in FIG. 6, a receiving circuit 42, a transmitting circuit 43, and a control circuit 44. In this case, the antenna 41 is connected to a first terminal 21 of the SPDT switch 20 used as an antenna switch, a second terminal 22 of the SPDT switch 20 is connected to the receiving circuit 42, and a third terminal 23 is connected to the transmitting circuit 43. The receiving circuit 42 and the transmitting circuit 43 are connected to the control circuit 44, and the control circuit 44 is connected to a first control terminal 24 and a second control terminal 25 of the SPDT switch 20.

In the communication apparatus 40 as described above, the control circuit 44 controls the first control terminal 24 and the second control terminal 25 of the SPDT switch 20, so that the antenna 41 and the receiving circuit 42 can be connected to each other to establish a reception condition, or the antenna 41 and the transmitting circuit 43 can be connected to each other to establish a transmission condition.

When the SPDT switch 20 according to the present invention is used as an antenna switch, a reduction in loss and a reduction in power consumption of the communication apparatus 40 can be achieved.

In FIG. 10, although the communication apparatus 40 is arranged by using the SPDT switch 20, communication apparatuses may be arranged by using the SPDT switches 28, 30, and 36, and the same operation as described above can be achieved.

According to the SPST switch of the present invention, the drain and the source of an FET are connected to each other in series through an induction element and a capacitor element, one terminal of the capacitor element is connected to a first terminal, the other terminal is connected to a second terminal, and the gate of the FET is connected to a control terminal. The capacitance of the capacitor element is made equal to the OFF capacitance of the FET, and the inductance of the induction element is set to be such a value that the induction element resonates at a signal frequency with the capacitor element. With this configuration, isolation in an OFF state is increased, transmission loss in an ON state is reduced, high electric power can be passed, and the linearity of a passing signal can be maintained through a range of small electric power to high electric power.

According to the SPDT switch of the present invention, when the SPDT switch is obtained using two of the SPST switches described above, the same advantage can be obtained.

The SPDT switch of the present invention is connected to a switch element which is turned on/off to be interlocked with an ON/OFF operation of the FET of the SPST switch, the gate of the FET of the SPST switch and the switching terminal of the switch element are connected to the control terminal. With this configuration, the number of control terminals can be reduced by one, and a cost reduction can be achieved.

According to the communication apparatus of the present invention, by using an SPDT switch according to the present invention, a reduction in loss and a reduction in power consumption of the communication apparatus can be achieved.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A single pole double throw (SPDT) switch, comprising:

a first terminal, a second terminal, and a control terminal;

a field effect transistor (FET) having a gate connected to the control terminal, a drain connected to the first terminal, and a source, the FET exhibiting an OFF capacitance from drain to source;

a capacitor element having a capacitance substantially equal to the OFF capacitance of the FET, the capacitor element having one end connected to the first terminal and another end connected to the second terminal;

an induction element having one end connected to the source of the FET and another end connected to the second terminal, an inductance of the induction element being set such that it resonates with the capacitor element at a signal frequency; and a switching element having first and second signal terminals and a switching terminal, the first signal terminal being coupled to the third terminal, the second signal terminal being coupled to the first terminal and the switching terminal being coupled to the control terminal such that the switching element is turned on and off synchronously with the FET.

2. The single pole double throw (SPDT) switch of claim 1, wherein the switching element is an FET, the first and second signal terminals being either of a drain and source, and the switching terminal being a gate.

3. A communication apparatus, comprising:

a single pole double throw (SPDT) switch, including:

a first terminal, a second terminal, and a control terminal;

a field effect transistor (FET) having a gate connected to the control terminal, a drain connected to the first terminal, and a source, the FET exhibiting an OFF capacitance from drain to source;

a capacitor element having a capacitance substantially equal to the OFF capacitance of the FET, the capacitor element having one end connected to the first terminal and another end connected to the second terminal;

an induction element having one end connected to the source of the FET and another end connected to the second terminal, an inductance of the induction element being set such that it resonates with the capacitor element at a signal frequency; and a switching element having first and second signal terminals and a switching terminal, the first signal terminal being coupled to the third terminal, the second signal terminal being coupled to the first terminal and the switching terminal being coupled to the control terminal such that the switching element is turned on and off synchronously with the FET;

an antenna coupled to the first terminal;

a receiving circuit coupled to the second terminal;

a transmitting circuit coupled to the third terminal; and a control circuit coupled to the first and second control terminals and being operable to provide switching signals to the first and second FETs such that the transmitting and receiving circuits are alternatively coupled to the antenna through the SPDT switch.

4. The communications apparatus of claim 3, wherein the switching element is an FET, the first and second signal terminals being either of a drain and source, and the switching terminal being a gate.

* * * * *